United States Patent [19]
Asano

[11] Patent Number: 5,267,208
[45] Date of Patent: Nov. 30, 1993

[54] SEMICONDUCTOR MEMORY DEVICE
[75] Inventor: Shintaro Asano, Tokyo, Japan
[73] Assignee: NEC Corporation, Tokyo, Japan
[21] Appl. No.: 656,525
[22] Filed: Feb. 19, 1991
[30] Foreign Application Priority Data
Feb. 19, 1990 [JP]  Japan .................................. 2-38957
[51] Int. Cl.⁵ ................................................ G11C 7/02
[52] U.S. Cl. ...................................... 365/210; 365/182
[58] Field of Search ................ 365/182, 205, 208, 210, 365/214

[56] References Cited
U.S. PATENT DOCUMENTS
4,799,089 1/1989 Fukuma et al. .................. 365/210 X
5,105,385 4/1992 Ohtsuka et al. .................. 365/210 X Primary Examiner—Steven Mottola
Attorney, Agent, or Firm—Sughrue, Mion, Zinn, Macpeak & Seas

[57] ABSTRACT

By provided a dummy region, having a shape similar to and being formed in the same process as, the active regions having transistors that constitute memory cells formed therein, between two transistors, the spacing between the active region and the dummy region is made to be equal to the spacing between other transistors. By reducing the nonuniformity in the gate width of the transistors within the memory cell array regions with the above arrangement, it is possible to prevent the reduction of the transistor performance, and to prevent a performance reduction and the generation of malfunctions due to a delay in the data output time of the semiconductor memory device.

19 Claims, 8 Drawing Sheets

SEMICONDUCTOR MEMORY DEVICE

BACKGROUND OF THE INVENTION

1. Field of the Invention

The present invention relates to a semiconductor memory device, and more particularly to the structure within the memory cell array region of a static random access memory (referred to as SRAM hereinafter).

2. Description of the Prior Art

In general, a semiconductor memory device is constructed by memory cell array regions, a decoder circuit and a selection circuit that are placed adjacent to the memory cell array regions, and the like. Among these constituents the memory cell array regions in particular are constructed by regularly arranging the memory cells. Consequently, transistors (generally, MOS transistors) that constitute the memory cells are arranged regularly within the memory cell array regions.

However, in an SRAM there exist a power supply line Vcc and a grounding power supply line GND within a memory cell array region. Accordingly, the regularity of arrangement of the transistors that are in the portions where the power supply lines are arranged is disturbed.

The transistors constituting a memory cell are manufactured, within active regions formed during a selective oxidation. Most of these active regions are formed in a regular pattern within the memory cell array region, but, as mentioned above, the regularity of the formation pattern of the active regions that are adjacent to the power supply lines is disturbed.

The present inventor discovered that the nonuniformity of size in such areas relative to a design target value is very large compared with that in other active regions that are formed regularly. In particular, when the size of the active region is smaller than the design target value the gate width of the transistor formed within the active region becomes smaller than the design target value. That the gate width becomes small means that the drain current becomes correspondingly small, and the performance of the transistor is reduced.

A reduction in the transistor performance gives rise to a delay in the potential shift of the digit line connected to this transistor, causes the data output time to be delayed, and results in not only a marked reduction in the performance but also the generation of malfunctions of the semiconductor memory device.

Consequently, a semiconductor memory device that has a wiring region within the memory cell array region, has a problem in that the performance of a part of the transistors forming a memory cell is decreased, this leads to a reduction in the performance of the semiconductor memory device as a whole and a reduction in reliability due to generation of malfunctions.

BRIEF SUMMARY OF THE INVENTION

Object of the Invention

The object of the present invention is to prevent the reduction in the performance of the transistors that form memory cells, and to prevent the reduction in performance and generation of malfunctions of a semiconductor memory device.

Summary of the Invention

The semiconductor memory device in accordance with the present invention comprises a first active region in which is formed one transistor that constitutes a first memory cell, a second active region in which is formed one transistor that constitutes a second memory cell, a power supply wiring region provided on an upper layer in the region between the first and the second active regions and a dummy region formed on the same layer as that of the two active regions on a lower layer in the region between the first active region and the second active region.

The dummy region has a shape similar to that of other active regions, and is formed by the same fabrication process as for other active regions.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Prior to the description of an embodiment of the present invention, problems to be solved by the present invention will be presented.

Figure 1:
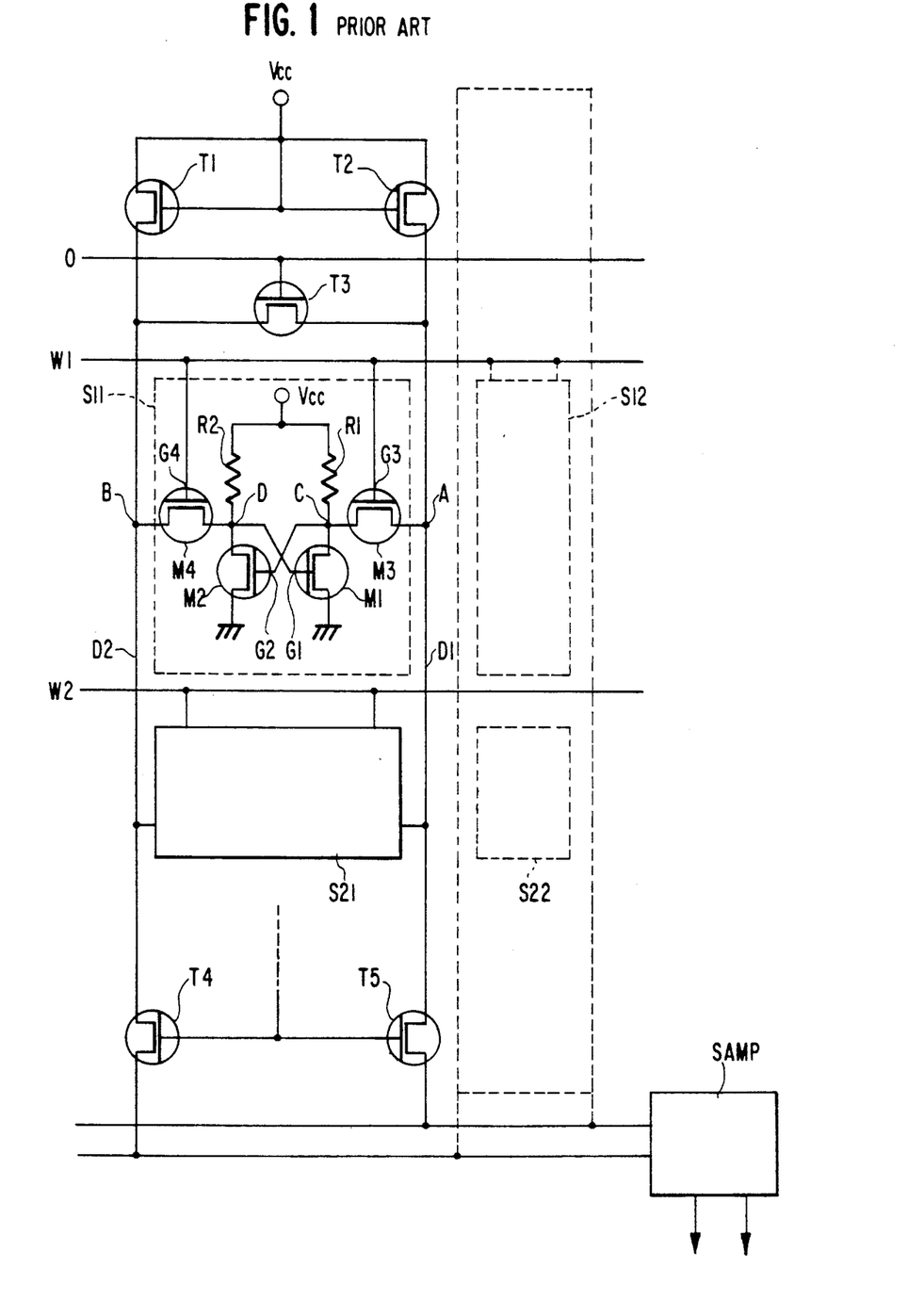
FIG. 1 is an example of circuit diagram of an SRAM.

FIG. 1 is a circuit diagram showing one example of construction of an SRAM whose memory cells are constructed by nMOS transistors. A memory cell array region is formed by arranging memory cells S11, S12, . . ., S21, S22, . . . in an array form. The respective memory cells are connected respectively to one of the word lines of W1, W2, . . . and to one of the pairs of the digit line D1, D2; . . . The digit line pair D1 and D2 are connected to a load circuit consisting of transistors T1 and T2, and a balancing circuit consisting of a transistor T3 and a signal $\phi$ in order to balance the potentials of the two lines with predetermined potentials. Further, there are provided column selection circuits T4, T5, . .

. for selecting either of the combination of the paired digit lines, and a sense amplifier SAMP for amplifying the potential difference of a selected pair of digit lines.

A memory cell that constitutes an SRAM (for example, S1) consists of a flip-flop circuit obtained by cross-coupling the input end and the output end of two inverters (an inverter consisting of a transistor M1 and a resistor R1, and an inverter consisting of a transistor M2 and a resistor R2), and transfer gate transistors M3 and M4 which are respectively connected between the two input and output ends C and D of the flip-flop and the digit lines D1 and D2, with their gates connected to the word line W1.

Such a semiconductor memory device determines whether the data stored within a memory cell is "0" or "1" by whether the combination of the potentials of the nodes C and D within the memory cell is a high potential and a low potential or a low potential and a high potential.

At the time of the read operation, a selected word line (for example, W1) is activated and the transfer gate transistors M3 and M4 connect the nodes C and D to the digit lines D1 and D2. Either of the potentials of these two digit lines drops in response to the states of the two nodes C and D within the memory cell, creating a potential difference between the two. The sense amplifier SAMP detects and amplifies the potential difference and sends it out to an output circuit (not shown).

At the time of write operation, contrary to the time of read operation, a potential difference corresponding to a write data is given to the digit lines D1 and D2, the transfer gate transistors M3 and M4 are energized and the potential state within the memory cell is forcibly set.

Figure 2:
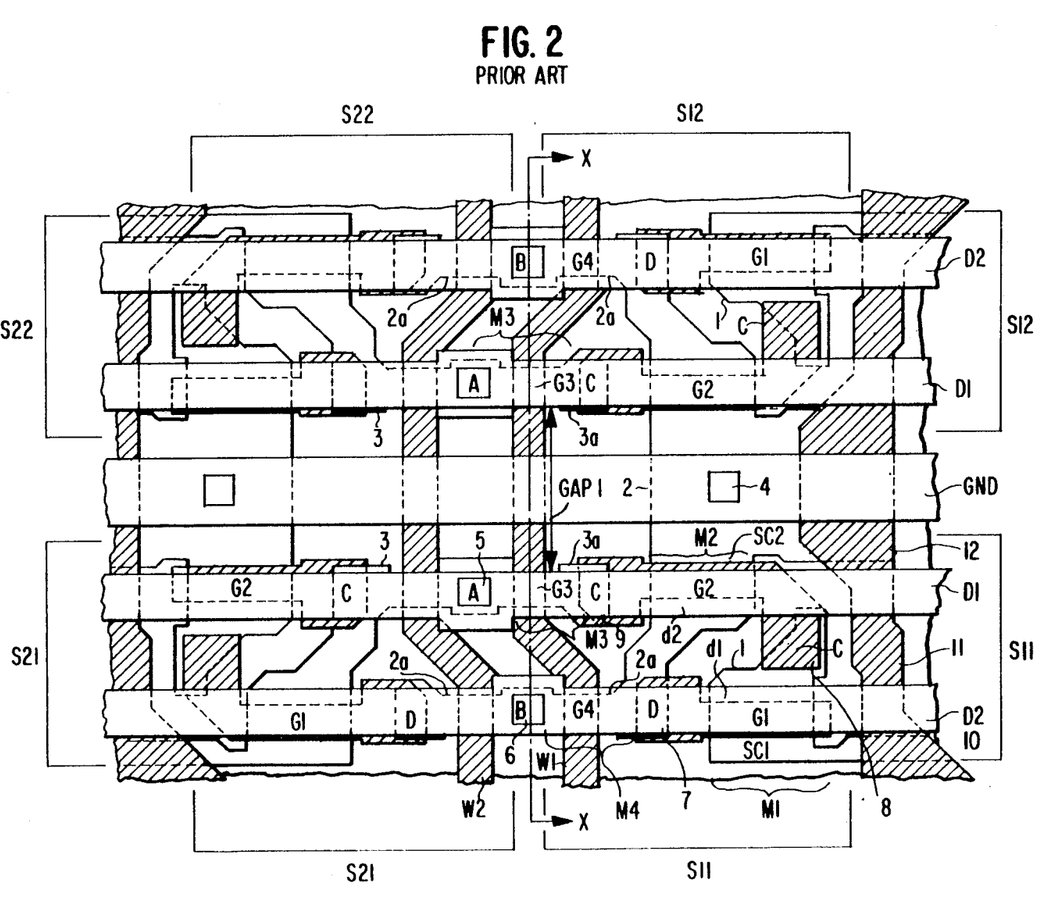
FIG. 2 is a plan view of the pattern of a part of the memory cell array region of a semiconductor memory device shown in FIG. 1.

FIG. 2 is a plan view showing the pattern of a part of the memory cell array region of the semiconductor memory device shown in FIG. 1. Identical reference numerals are given to the constituents that are identical to those in FIG. 1. In the figure, the regions surrounded by the thin solid lines indicate the active regions sectioned by a field oxide film formed by a selective oxidation, the hatched regions indicate the polycrystalline silicon regions in the upper layer of the active regions, the cross-hatched regions indicate the direct contact regions between the polycrystalline silicon regions and the active regions and the regions surrounded by the thick solid line indicate the aluminum wirings further in the upper layer of the polycrystalline silicon regions.

The transistor M1 is provided within an active region 1, its gate electrode G1 consisting of a polycrystalline silicon film is connected to a drain region d2 (node D) of the transistor M2 via a direct contact 7, its source region sc1 is connected to a polycrystalline silicon wiring 11 via a direct contact 10 and its drain region d1 is connected to the gate electrode G2 (node C), consisting of a polycrystalline silicon film, of the transistor M2 via a direct contact 8.

The transistor M2 is formed within an active region 2, with its source region sc2 connected to the polycrystalline silicon wiring 11 via a direct contact 12 as well as to the grounding power supply line GND consisting of an aluminum wiring via a contact hole 4.

The transistor M3 is provided within an active region 3a which is an extended part of an active region 3, its source and drain route is provided between a contact hole 5 (node A) connected to the digit line D1 and a direct contact 9 (node C) connected to the gate electrode G2 of the transistor M2, and the crossing region of the word line W1 consisting of a polycrystalline silicon wiring and the active region 3a serves as the gate electrode G3.

The transistor M4 is provided within an active region 2a which is an extended part of the active region 2, and runs in parallel to the length direction of the active region 3a. The crossing region of the word line W1 consisting of a polycrystalline silicon wiring and the active region 2a, provided between a contact hole 6 (node B) that connects the source and drain route of the transistor M4 and the digit line D2; and a direct contact 7 (node D) connected to the gate electrode G1 of the transistor M1, serves as the gate electrode G4 of the transistor M4.

It should be mentioned that the load resistors R1 and R2 and the power supply line Vcc are not shown in FIG. 2; both of them are formed within the memory cell array region using a polycrystalline silicon film on a layer which is different from that of the polycrystalline silicon film that is forming the transistor.

One of the memory cells, namely, S11, is constructed using the transistors M1 to M4 and the like described in the above. The memory cells S12, S21 and S22 with the same circuit construction are also shown in FIG. 2.

In the memory cell array region, the power supply lines Vcc for supplying power to the memory cells and the grounding power lines GND are led into the interior of the memory cell array region and arranged between the memory cells from the peripheral part outside of the memory cell array region. Generally, one power supply line is arranged for every 6 to 12 memory cells. In FIG. 2 is shown a portion in which a grounding power line GND consisting of an aluminum wiring is arranged between the group of the memory cells S11 and S21 and the group of the memory cells S12 and S22 on a layer which is above that of the active regions and the polycrystalline silicon layers.

Now, the transistors that constitute the memory cells are formed within the active regions sectioned by a field oxide film that is formed by a selective oxidation in the initial stage of the fabrication process. Accordingly, within the memory cell array region, the majority of the active regions for realizing the transistors are formed according to a regular pattern. For example, the active regions for realizing the transistors M1, M2, M3 and M4 shown in FIG. 2 are formed within the memory cell array region according to a regular pattern. This will be explained by making reference to FIG. 3.

Figure 3:
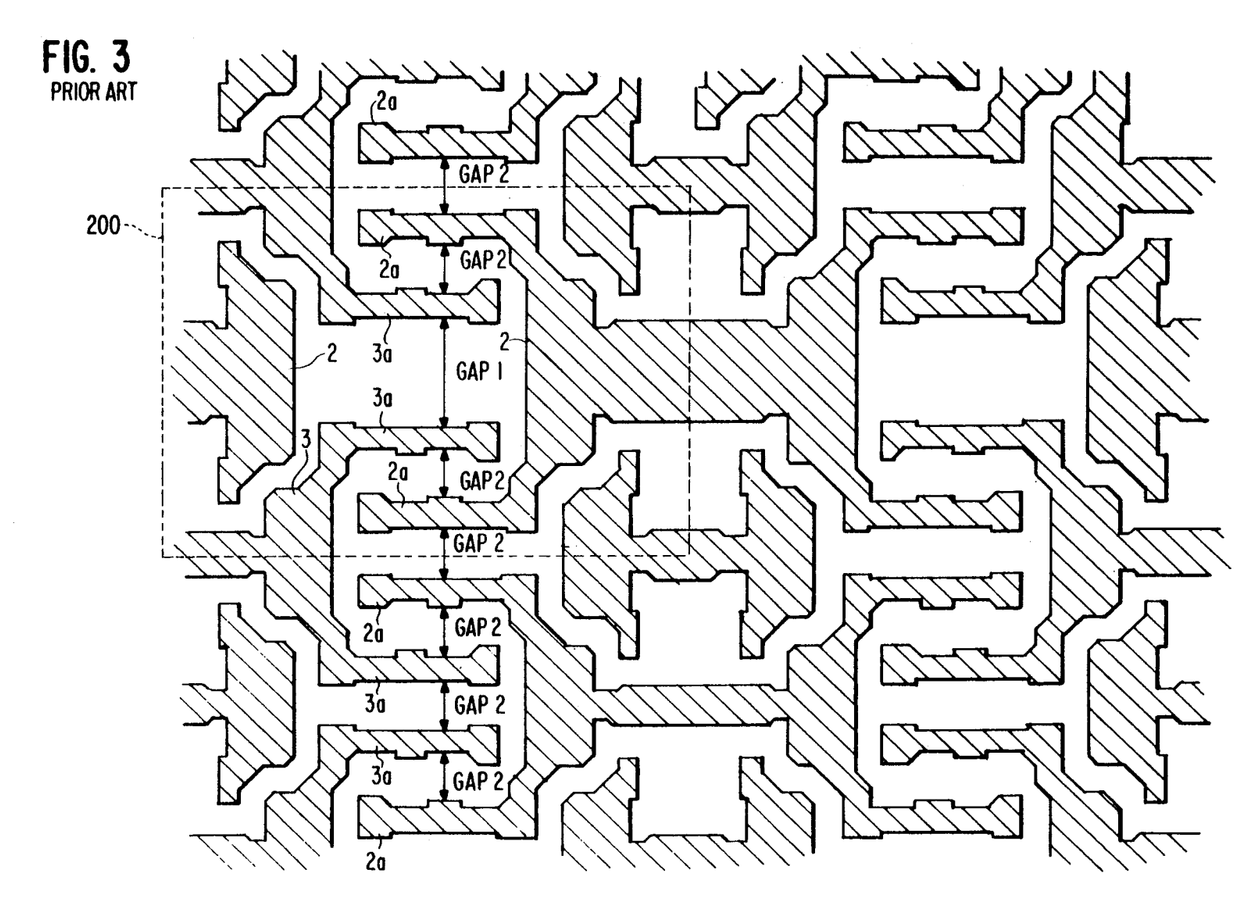
FIG. 3 is a plan view showing the pattern of a part of the active regions of the memory cell array region in FIG. 1.

FIG. 3 is a plan view showing only the active regions within the memory cell array region covering a wider region than shown in FIG. 2. The region 200 encircled by the broken line is the range shown in FIG. 2. As described in the above, the transistor M2 is formed within the region 3a which is an extended part of the active region 3, and the transistor M4 is formed within the region 2a which is an extended part of the active region 2 and runs in parallel to the length direction of the region 3a. As is clear from FIG. 3, within the memory cell array region that is not shown specifically in FIG. 2, the formation pattern for the active regions (2a and 3a) is regularly arranged with a spacing GAP2.

Since, however, power supply lines are arranged within the memory cell array region, the regularity of arrangement is disturbed for the transistors that are formed in the periphery of the regions where the power supply lines are arranged. Namely, as shown in FIG. 2, a grounding power line GND is arranged between the group of the memory cells S11 and S21 and the group of the memory cells S12 and S22, consequently the spacing GAP1 between the regions 3a in which the transistors M3 are formed within the respective memory cells becomes greater than the spacing GAP2 between other active regions (2a or 3a) (see also FIG. 3). Accordingly, the regularity of the formation pattern of the active regions 3a for forming these transistors is disturbed in the portions adjacent to the grounding power line GND.

Figure 4:
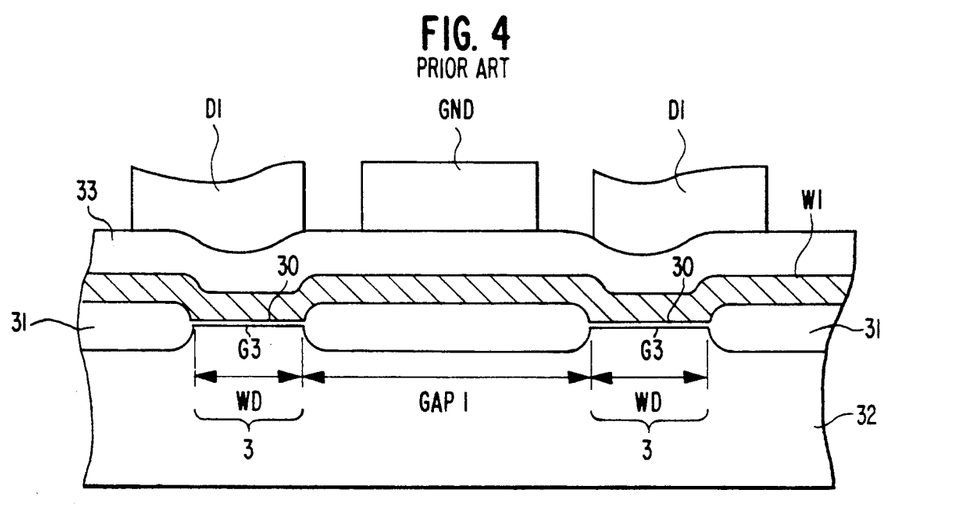
FIG. 4 is a sectional view along the line X—X in FIG. 2.

FIG. 4 is a sectional view along the line X—X in FIG. 2. A gate oxide film 30 is formed on the active regions 3 sectioned by a field insulating film 31 in the surface part of a P-type silicon substrate 32, and a word line W1 consisting of a polycrystalline silicon film is arranged on top of it. The portions of the active regions 3a become the gate electrodes G3 of the transistors M3 (FIGS. 1 and 2), and WD becomes the gate width of these transistors. On the word line W1, digit lines D1 and the grounding power line GND consisting of aluminum wirings are arranged via an insulating layer 33 to cross perpendicularly the word line W1. Since transistors cannot be formed on the lower layer part where the grounding power line GND is arranged, no active regions are formed and the field insulating film 31 alone exists there. Accordingly, the spacing between the transistors M3 in the adjacent portions of the grounding power line GND, namely, the spacing GAP1 between the active regions 3a becomes greater than the spacing GAP2 between other active regions (2a or 3a), and hence the regularity of the formation pattern of the active regions 3 in these portions is distrubed.

In the active regions where the regularity of the formation pattern is disturbed, the nonuniformity of the size relative to a design target value is very large in comparison to that in other active regions that are formed regularly.

Figure 5:
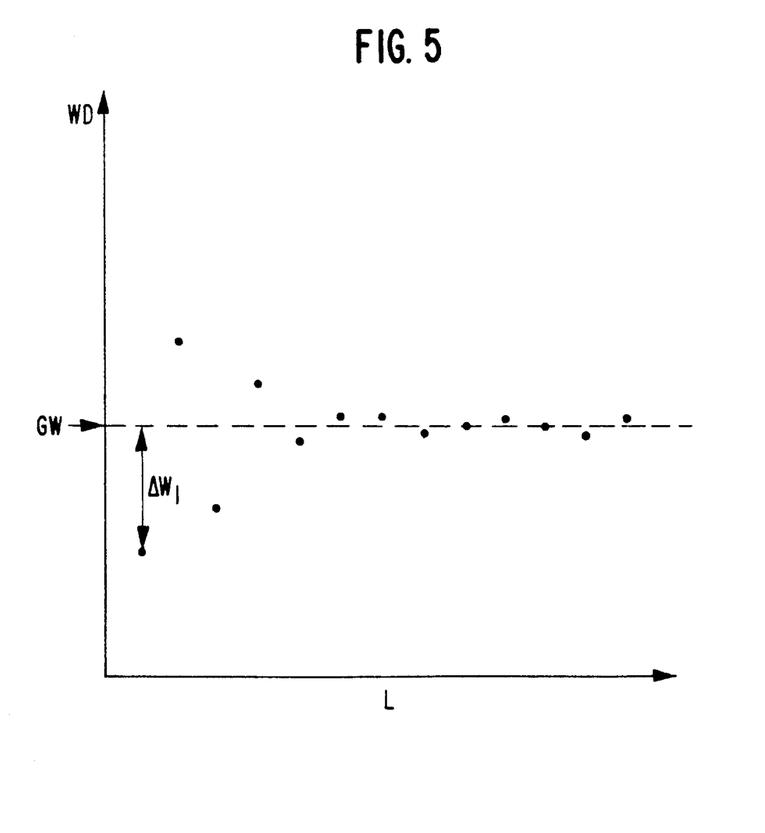
FIG. 5 is a graph showing the nonuniformity of the gate width relative to a design target value in the semiconductor memory device in FIG. 2.

An example of such a nonuniformity is shown in FIG. 5. In the figure, the ordinate shows the width of the active region 3a shown in FIG. 4, namely, the width length WD that is to become the gate width of the transistor M3 (FIGS. 1 and 2), and the abscissa shows the distance L from an active region to the grounding power line GND. In addition, GW is a design target value of the gate width. As is clear from FIG. 5, the difference ($\Delta W1$) between the width length WD of the active region which becomes the gate width of the transistor and the design target value GW becomes larger when the active region is closer to the grounding power line GND. For example, for a design target value of 7 $\mu$m the maximum value of $\Delta W1$ becomes 3 $\mu$m.

Figure 6:
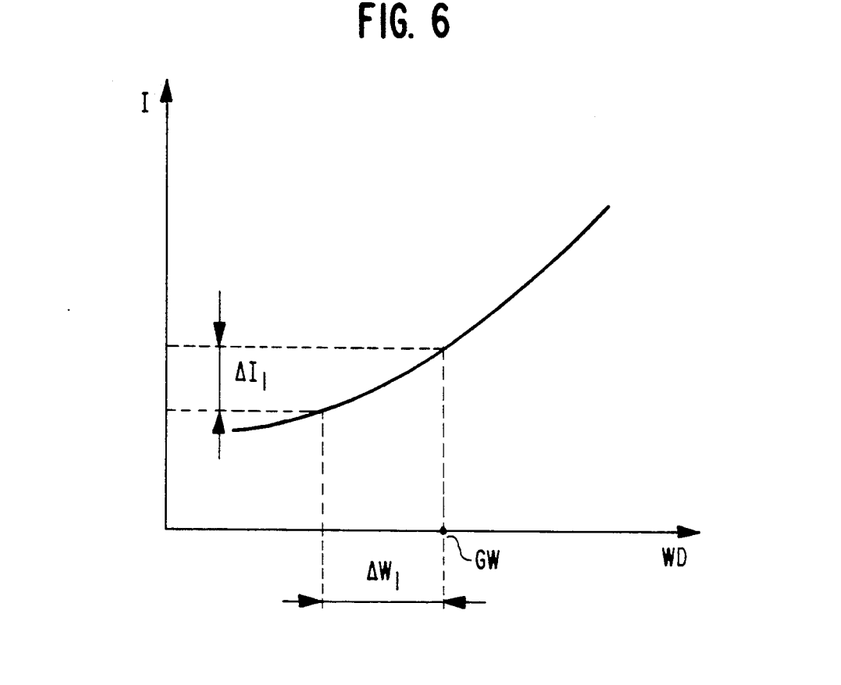
FIG. 6 is a graph showing the relation between the gate width and the drain current of the transistor.

When the nonuniformity of the size of the active region, in particular the nonuniformity of the gate width of the transistor is smaller than a design target value there are following troubles. Namely, as shown in FIG. 6, when the width length WD becomes smaller than the design target value GW by $\Delta W1$, the drain current I of the transistor decreases by $\Delta I$. For example, if the gate width is decreased by 3 $\mu$m as in the above example for the drain current of 0.25 mA when the gate width is equal to the design target value, the drain current decreases by 0.144 mA and the drain current becomes only about 40% of the current when the gate width coincides with the design target value. In other words, the transistor performance is reduced.

Figure 7:
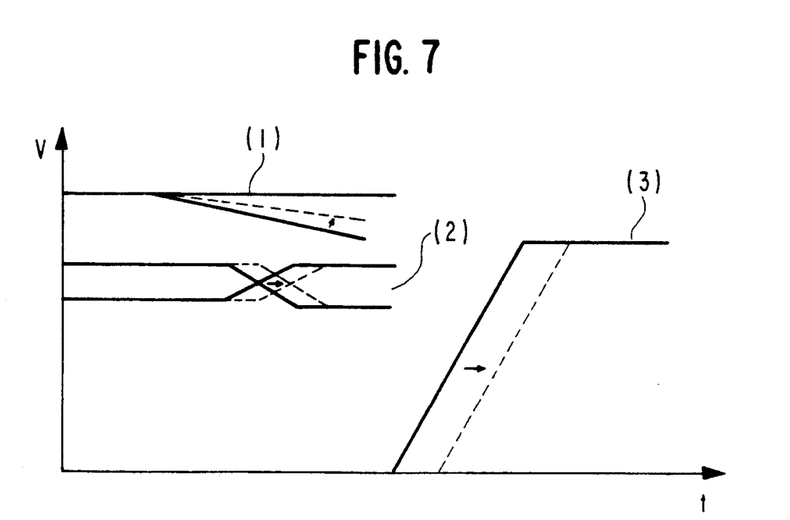
FIG. 7 is a waveform diagram showing the voltage level waveform and the output waveform of a digit line of the semiconductor memory device.

As shown in FIG. 7, a reduction in the transistor performance (1) causes a delay in the potential shift of the digit line connected to the transistor (shift from the solid line to the broken line) and (2) causes a delay of the output of the sense amplifier that amplifies the potential difference of the digit line. As a result, (3) the data output time of the semiconductor memory device is delayed (by about 5 nsec), which not only sharply reduces the performance of the semiconductor memory device, but also sometimes becomes the cause of malfunctions.

The nonuniformity in the size of the active regions that becomes the cause of the aforementioned troubles is considered to be generated by the following reasons.

The active regions are formed after growing an oxide film on the surface of a substrate by thermal oxidation, depositing a silicon nitride film on top of it by a CVD method, and selectively removing the silicon nitride film from the surface by the lithography technique except for the portions that are to become the active regions; In other words, the size of the active regions is determined by the size of the silicon nitride film selectively left by the lithography technique.

However, when the regularity of the formation pattern of the active regions is disturbed in the portions adjacent to the power supply wirings, during the application of the lithography technique for selectively removing the silicon nitride film, that is, during the exposure by the use of a predetermined mask pattern after coating a photoresist, the exposure conditions are changed in the sections where the regularity is disturbed due to the changes in the interference of the light. Changes in the exposure conditions lead to a large variability in the size of the silicon nitride film pieces that are selectively left intact relative to the design target value, which results in nonuniformity of the size of the active regions.

Next, referring to FIG. 8 to FIG. 11, an embodiment of the present invention will be described. In this embodiment a description will also be presented, analogous to the case of device in FIG. 1, with reference to an example of an SRAM whose memory cells are constructed by nMOS transistors. According, the circuit construction such as the memory cells S11, S12, S21, S22, ... and the like is the same as in FIG. 1 so that the description on its construction and the principle of operation will be omitted.

Figure 8:
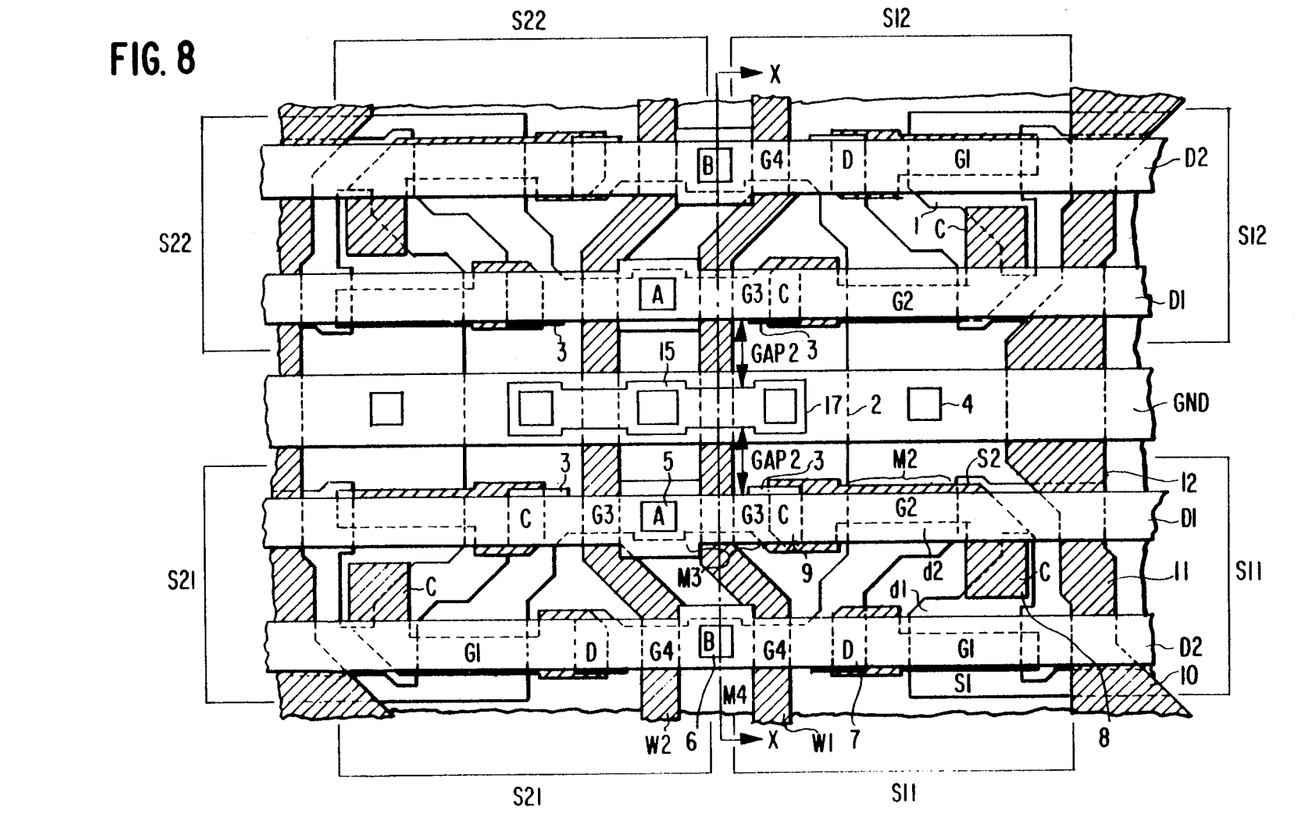
FIG. 8 is a plan view showing the pattern of a part of the semiconductor memory device in accordance with an embodiment of the present invention.
Figure 9:
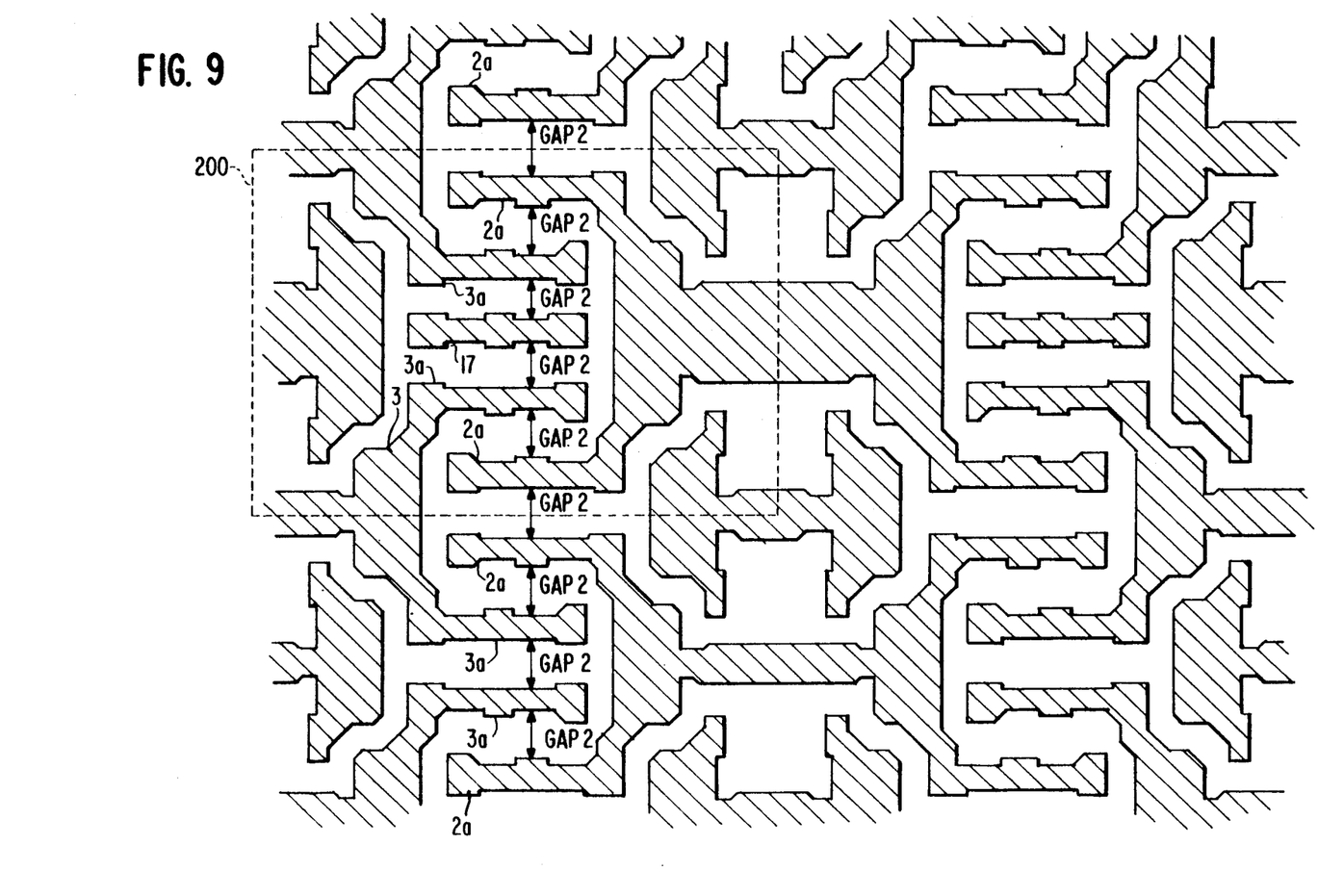
FIG. 9 is a plan view showing the pattern of a part of the active regions of the memory cell array region of the semiconductor memory device in accordance with the embodiment of the present invention.

FIG. 8 is a plan view showing the pattern of a part of the memory cell array region of the semiconductor memory device in accordance with the present invention. The constituent parts identical to those in FIG. 1 and FIG. 2 are assigned identical symbols. In FIG. 8 are shown four memory cells S11, S12, S21 and S22 that have the identical circuit construction similar to the case in FIG. 2. The pattern construction of each of the memory cells is completely identical to that of FIG. 2.

The difference of the present embodiment from the prior art device shown in FIG. 2 is not the pattern construction of the regions in which are formed the memory cells S11, S12, S21 and S22, but resides in the pattern construction of the regions in which are arranged the grounding power line GND within the memory cell array region. In the present embodiment there is arranged a grounding power line GND between the memory cell S11 and the memory cell S12. As mentioned above, in this region the transistors M3 within the respective memory cells exist with the spacing between them to be greater than the spacing GP2 between the active regions (2a or 3a) in which the transistors (M3 or M4) are formed.

Therefore, in the present embodiment, dummy regions having a shape similar to that of the active regions 3a are formed beteen two active regions 3a in the manufacturing process which are the same as that of the formation of the active regions 3a in which the transistors M3 are formed. With this arrangement, the spacing between the active regions 3a and the dummy region 17 becomes equal to the spacing GAP2 between other active regions (2a or 3a) as is clear from FIG. 9. Here, the dummy region 17 is connected to the grounding power line GND via contacts 15 in order to prevent the dummy region 17 from being found in a floating state.

With such a construction, the regularity of the formation pattern of the active regions for forming transistors that constitute the memory cells can be made without disturbance in the portions adjacent to the power supply wirings.

Figure 10:
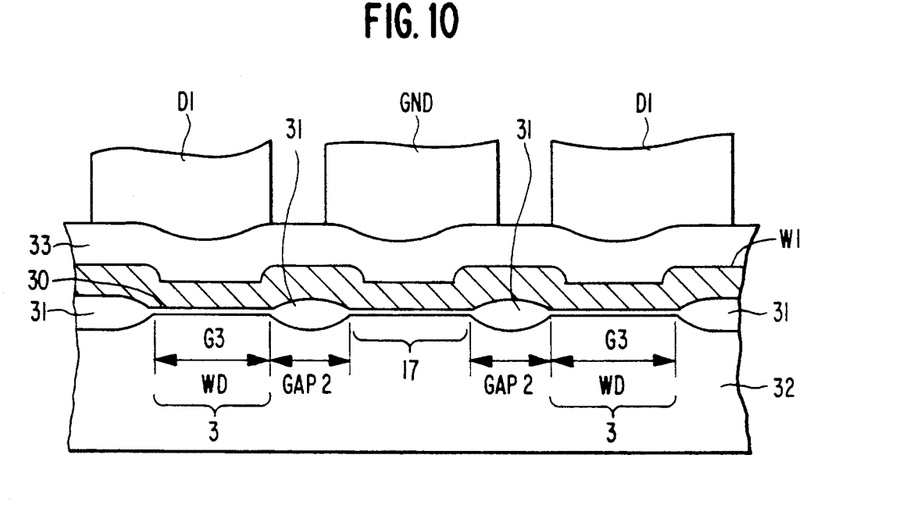
FIG. 10 is a sectional view along the line X—X in FIG. 8.

FIG. 10 is a sectional view along the line X—X in FIG. 8. A gate oxide film 30 is formed on the active regions 3 sectioned by a field insulating film 31, and a word line W1 consisting of a polycrystalline silicon film is arranged on top of it. Digit lines D1 and a grounding power line GND consisting of aluminum wirings are arranged in the form perpendicularly crossing the word line W1 via an insulating layer 33. In the lower layer portions in which the grounding power lines GND are arranged there are formed dummy regions 17 having similar shape to that of the active regions 3a. With this arrangement, the spacing between the active region 3a and the dummy region 17 becomes equal to the spacing GAP2 between other active regions (2a or 3a).

Figure 11:
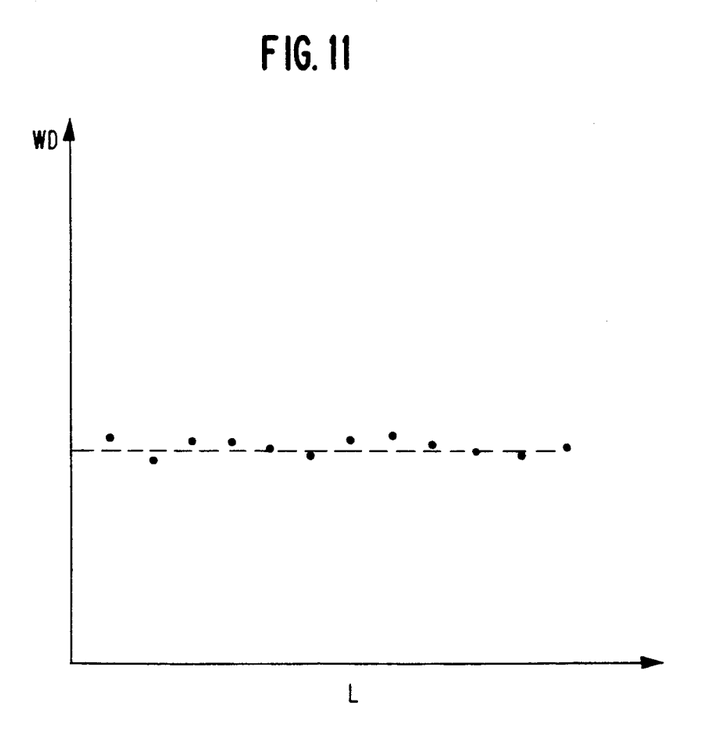
FIG. 11 is a graph showing the nonuniformity of the gate width relative to a designe target value in the semiconductor memory device in FIG. 8.

In FIG. 11 is shown the nonuniformity of the size of the active region relative to a design target value for the case where the active regions are formed according to a regular pattern. As is clear from the figure, the width length WD of the active region which is to become the gate width of the transistor does not deviate from a design target value GW even in the vicinity of the grounding power line GND. In other words, it is possible to prevent the reduction of the performance of the transistors within the memory cell array region.

By adopting a construction as in the present embodiment, it is possible to prevent nonuniformity in the size of the active regions. The reason for this is considered to be that the regularity of the formation pattern of the active regions will not be disturbed even in the adjacent portions of the power supply wirings by means of the dummy regions 17, so that there will not be generated changes in the interference of light during the mask pattern exposure for the formation of the active regions.

As described in the above, in accordance with the present invention it is possible to prevent the reduction in the transistor performance of the transistors within the memory cell array region, so that there will not be generated a delay in the potential shift of the digit line connected to the transistor and there will not be generated a delay in the output of the sense amplifier that amplifies the potential difference between the digit lines.

Accordingly, it became possible to present performance reduction and malfunctions of a semiconductor memory device caused by a delay in the data output time of the semiconductor memory device.

In the embodiment described above the case of an SRAM consisting of nMOS transistors has been taken up as an example, but the present invention need not be limited to this case alone. For example, the present invention can be applied to an SRAM consisting of pMOSs. In that case one is only required to replace the grounding power line GND of the wiring pattern shown in FIG. 8 by the power supply line Vcc.

Moreover, the application of the present invention is not limited to SRAMs, but can also be applied to memories in which memory cells are arrayed, that is, those containing a regularly arranged memory cell array, for example, dynamic RAMs (DRAMs), programmable read only memories (PROMs), erasable PROMs (EPROMs), electrically erasable PROMs (EEPROMs), shift registers, CCD memories, and the like. Therefore, the circuit construction and the pattern construction available are not limited to those shown in FIG. 1 and FIG. 8.

Furthermore, the term active region used in connection with the above description simply means a region usable for element formation partitioned by a field oxide film formed by a selective oxidation method. In other words, such a region does not necessarily means a region to which impurities or the like are implanted and diffused. In the case of the present embodiment, after the formation of the dummy regions 17 by a selective oxidation method, and following the formation of polycrystalline silicon films for creating the gate electrodes as in other active regions, the dummy regions 17 are implanted with impurities by an impurity implantation process for forming the source and drain regions. However, it is possible in the present embodiment to avoid the implantation of impurities to the dummy regions by devising a mask pattern, increasing the number of masking processes, or the like.

Although the invention has been described with reference to a specific embodiment, this description is not to be constructed in a limiting sense. Various modifications of the disclosed embodiment will become apparent to persons skilled in the art upon reference to the description of the invention. It is therefore contemplated that the appended claims will cover any modifications or embodiments as fall within the true scope of the invention.

What is claimed is:

1. A semiconductor memory device comprising:
   a first active region wherein one transistor constituting a first memory cell is formed,
   a second active region wherein one transistor constituting a second memory cell is formed,
   a wiring region provided on an upper layer in the region between said first and second active regions, and
   a dummy region provided on the same layer as the two active regions and on a lower layer of said wiring region in the region between said first active region and said second active region;
   wherein said dummy region is a region sectioned by a field oxide film formed by a selective oxidation method.

2. A semiconductor memory device as claimed in claim 1, wherein the one transistor constituting said first memory cell and the one transistor constituting said second memory cell are an identical transistor for the reasons of the construction of the respective circuits.

3. A semiconductor memory device as claimed in claim 1, wherein said dummy region has a shape similar to those of said first and second active regions.

4. A semiconductor memory device as claimed in claim 1, wherein said dummy region is formed in the identical fabrication process as that of said first and second active regions.

5. A semiconductor memory device as claimed in claim 1, wherein the one transistor constituting said first memory cell and the one transistor constituting said second memory cell are transistors of the identical type.

6. A semiconductor memory device as claimed in claim 2 or 7, wherein the one transistor constituting said first memory cell and the one transistor constituting said second memory cell are MOS transistors.

7. A semiconductor memory device comprising:
an active region string forming region obtained by arranging in one direction a plurality of active regions wherein are formed transistors constituting memory cells
a wiring region for forming an upper layer wirings arranged so as to be orthogonal to the direction of said active regions string forming region, and
a dummy region provided on the same layer as that of said active regions and on a lower layer of said wiring region at the crossing region of said active region string forming region and said wiring region;
wherein said dummy region is a region sectioned by a field oxide film formed by a selective oxidation method.

8. A semiconductor memory device as claimed in claim 7, wherein the spacing between said dummy region and said active region adjacent thereto is equal to the spacing between a plurality of active regions constituting said active region string forming region.

9. A semiconductor memory device as claimed in claim 7, wherein said wiring is a power supply wiring.

10. A semiconductor memory device as claimed in claim 1 or 7, wherein said plurality of memory cells include a memory cell array region that is arranged in an arrayed form, and word lines and pairs of two digit lines that are connected to said plurality of memory cells.

11. A semiconductor memory device as claimed in claim 5 or 7, wherein said memory is constructed by a flip-flop circuit formed by cross-coupling two inverters and two transfer gate transistors whose gates are connecting to a word line.

12. A semiconductor memory device as claimed in claim 5 or 7, wherein an SRAM is constructed by said memory cells.

13. A semiconductor memory device as claimed in claim 1 or 7, wherein a DRAM is constructed by said memory cells.

14. A semiconductor memory device as claimed in claim 1 or 7, wherein an EPROM is constructed by said memory cells.

15. A semiconductor memory device as claimed in claim 1 or 7, wherein an EEPROM is constructed by said memory cells.

16. A semiconductor memory device as claimed in claim 1 or 7, wherein a shift register is constructed by said memory cells.

17. A semiconductor memory device as claimed in claim 1 or 7, wherein a CCD memory is constructed by said memory cells.

18. A semiconductor memory device comprising:
first and second memory cells arranged in parallel to each other, each of said first and said second memory cells having first and second active regions arranged in parallel with a space therebetween and first and second transistors formed in said first and said second active regions, respectively, said first active region of said first memory cell facing with said second active region of said second memory cell;
a field insulating film formed on a field region between said first and second memory cells;
a dummy region formed in said field region between said first and said second memory cells;
a word line formed to cross said first and said second active regions of said first and said second memory cells and said dummy regions, to serve as gate electrodes of said first and said second transistors;
an insulating layer covering said word line, said field insulating film, said dummy region and said first and said second active regions in said first and said second memory cells;
a power line formed on said insulating layer and arranged in parallel to said first and said second active regions in said first and said second memory cells along said dummy region; and
first and second digit lines connected respectively to said first and said second memory cells and formed on said insulating layer.

19. A semiconductor memory device as claimed in claim 18, wherein said dummy region is connected to said power line.

* * * * *